United States Patent
Kamiya et al.

(10) Patent No.: US 10,595,436 B2
(45) Date of Patent: Mar. 17, 2020

(54) POWER CONVERTER FOR RAILROAD VEHICLE

(71) Applicant: FUJI ELECTRIC CO., LTD., Kawasaki-shi, Kanagawa (JP)

(72) Inventors: Akira Kamiya, Koganei (JP); Kimihisa Kaneko, Yokohama (JP); Yoshihisa Uehara, Suzuka (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 58 days.

(21) Appl. No.: 15/876,868

(22) Filed: Jan. 22, 2018

(65) Prior Publication Data

US 2018/0279502 A1 Sep. 27, 2018

(30) Foreign Application Priority Data

Mar. 27, 2017 (JP) ................. 2017-060365

(51) Int. Cl.
| | | |
|---|---|---|
| *H05K 7/20* | (2006.01) | |
| *B61D 27/00* | (2006.01) | |
| *H01L 23/467* | (2006.01) | |
| *B61C 3/00* | (2006.01) | |
| *B61C 17/00* | (2006.01) | |
| *H01L 23/367* | (2006.01) | |

(52) U.S. Cl.
CPC ........... *H05K 7/20145* (2013.01); *B61C 3/00* (2013.01); *B61C 17/00* (2013.01); *B61D 27/0072* (2013.01); *H01L 23/3672* (2013.01); *H01L 23/467* (2013.01); *H05K 7/209* (2013.01); *H05K 7/20409* (2013.01); *B60L 2200/26* (2013.01)

(58) Field of Classification Search
CPC .......... H05K 7/20145; H05K 7/20409; H05K 7/209; H01L 23/3672; H01L 23/467; B61C 17/00; B61C 3/00; B61D 27/0072; B60L 2200/26
See application file for complete search history.

(56) References Cited

U.S. PATENT DOCUMENTS

| | | | |
|---|---|---|---|
| 6,031,720 A | * | 2/2000 | Crane, Jr. ............. H01L 23/467 361/695 |
| 8,813,832 B2 | | 8/2014 | Miki et al. |
| 2005/0286232 A1 | * | 12/2005 | Chen ................... H01L 23/3672 361/710 |

FOREIGN PATENT DOCUMENTS

| | | | | |
|---|---|---|---|---|
| JP | H10-322062 A | | 12/1998 | |
| JP | 2000-092819 | * | 3/2000 | ......... H05K 7/20918 |
| JP | 2000092819 A | * | 3/2000 | ......... H05K 7/20918 |
| JP | 2001-332883 A | | 11/2001 | |
| JP | 2003-60135 A | | 2/2003 | |
| JP | 3469475 B2 | | 9/2003 | |
| JP | 3850319 B2 | | 9/2006 | |

(Continued)

*Primary Examiner* — Mukundbhai G Patel
*Assistant Examiner* — Zhengfu J Feng
(74) *Attorney, Agent, or Firm* — Manabu Kanesaka

(57) ABSTRACT

A power converter for a railroad vehicle includes a first fin and a second fin having outer shapes different from each other as viewed in an alignment direction. On both ends of the first fin and the second fin in a running direction, non-overlapping regions in which the first fin and the second fin do not face each other in the alignment direction are located so as to sandwich an overlapping region, in which the first fin and the second fin face each other in the alignment direction, therebetween.

9 Claims, 8 Drawing Sheets

(56) References Cited

FOREIGN PATENT DOCUMENTS

| JP | 2007-208116 A | 8/2007 |
|---|---|---|
| JP | 4630953 B2 | 11/2010 |

* cited by examiner

FIG.1 [FIRST EMBODIMENT]
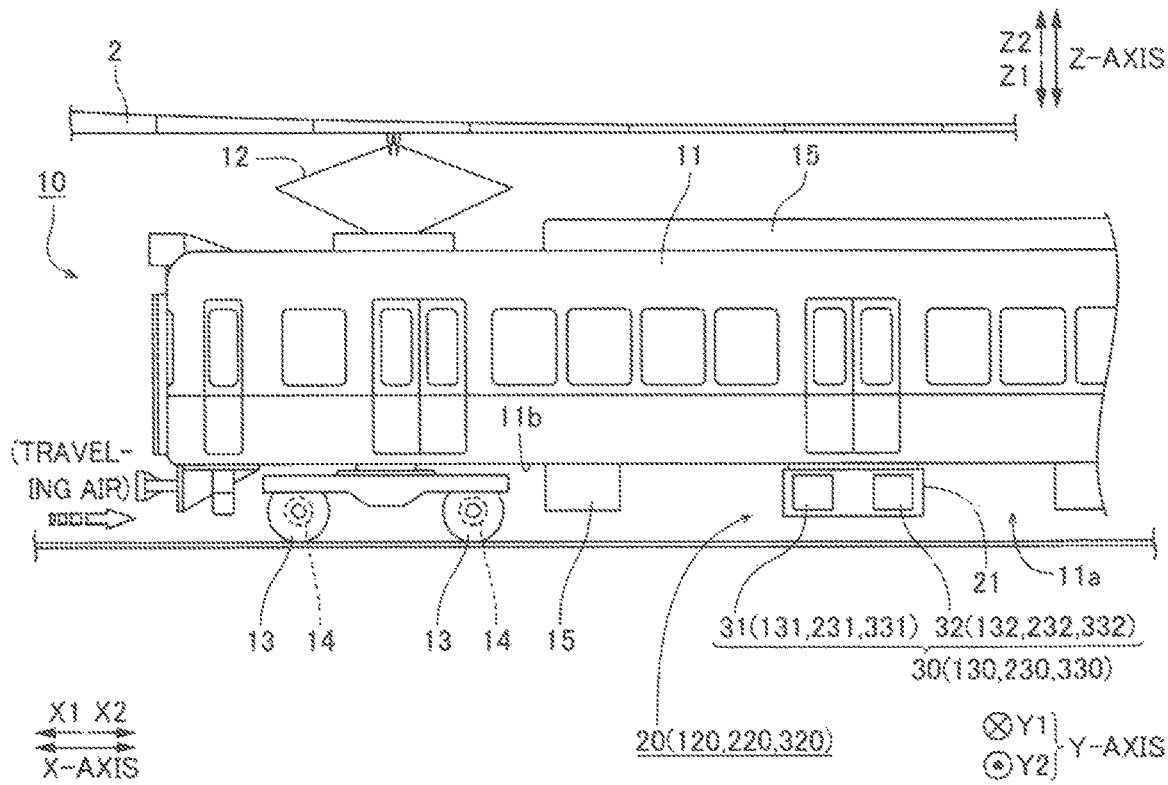
FIG.2
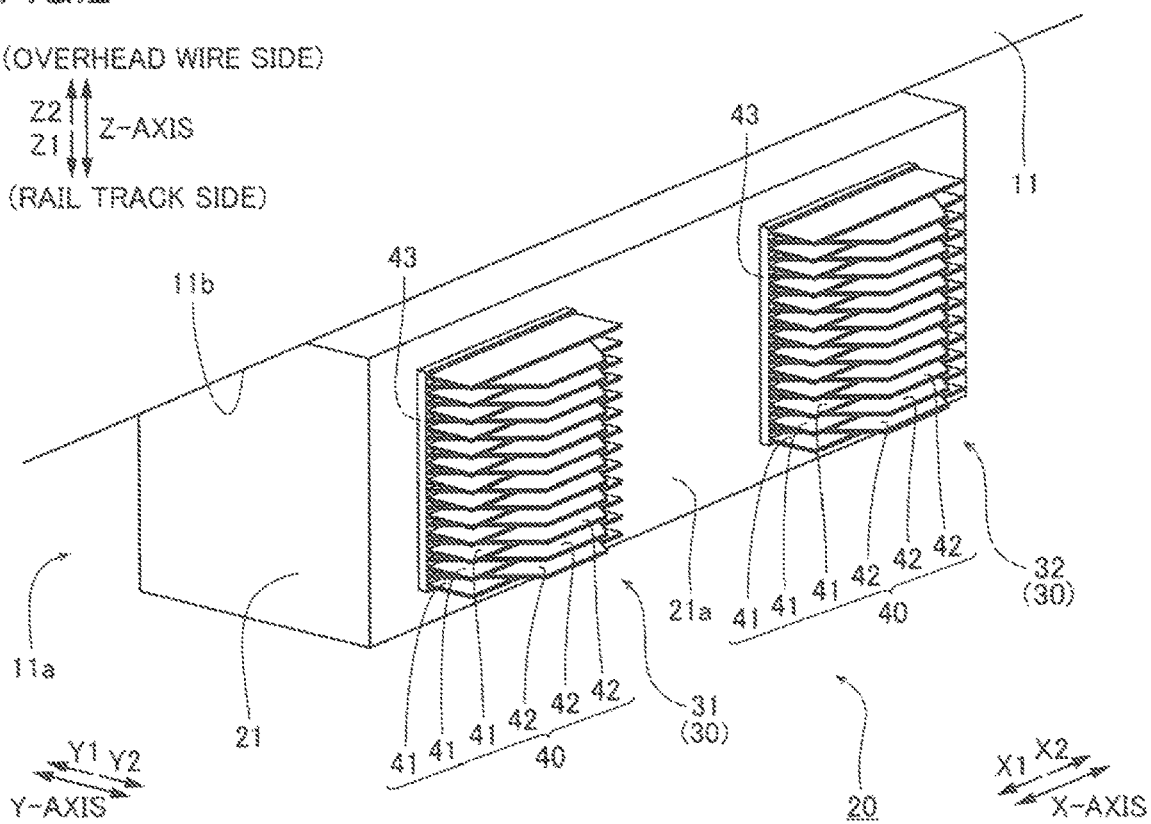

FIG.7
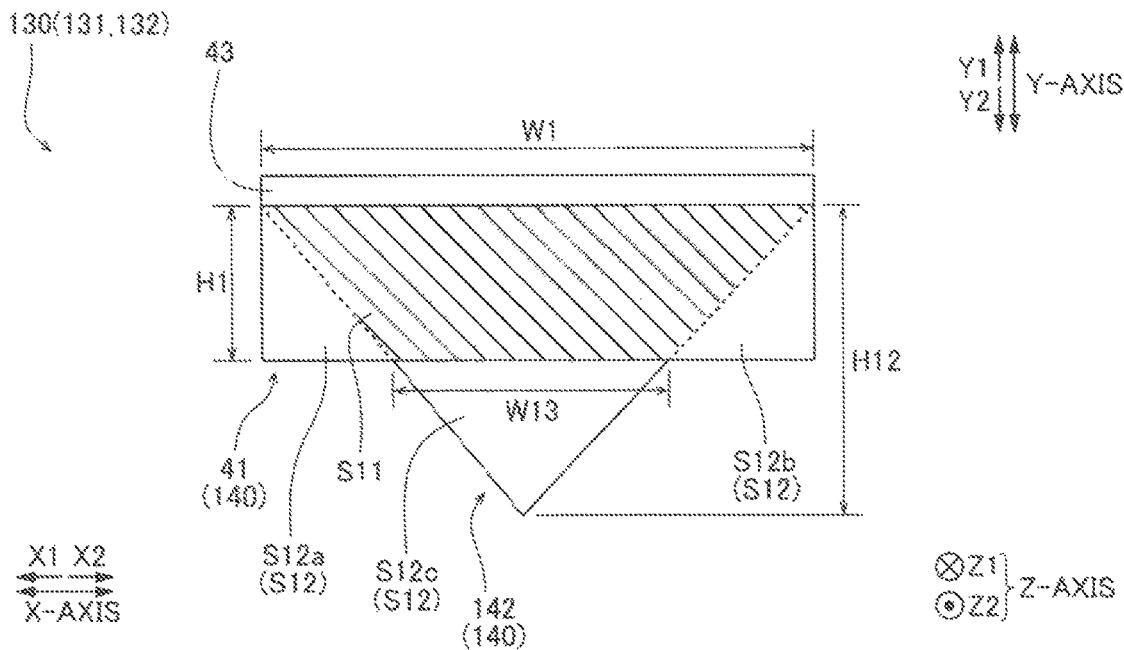
FIG.8 (SECOND MODIFICATION)
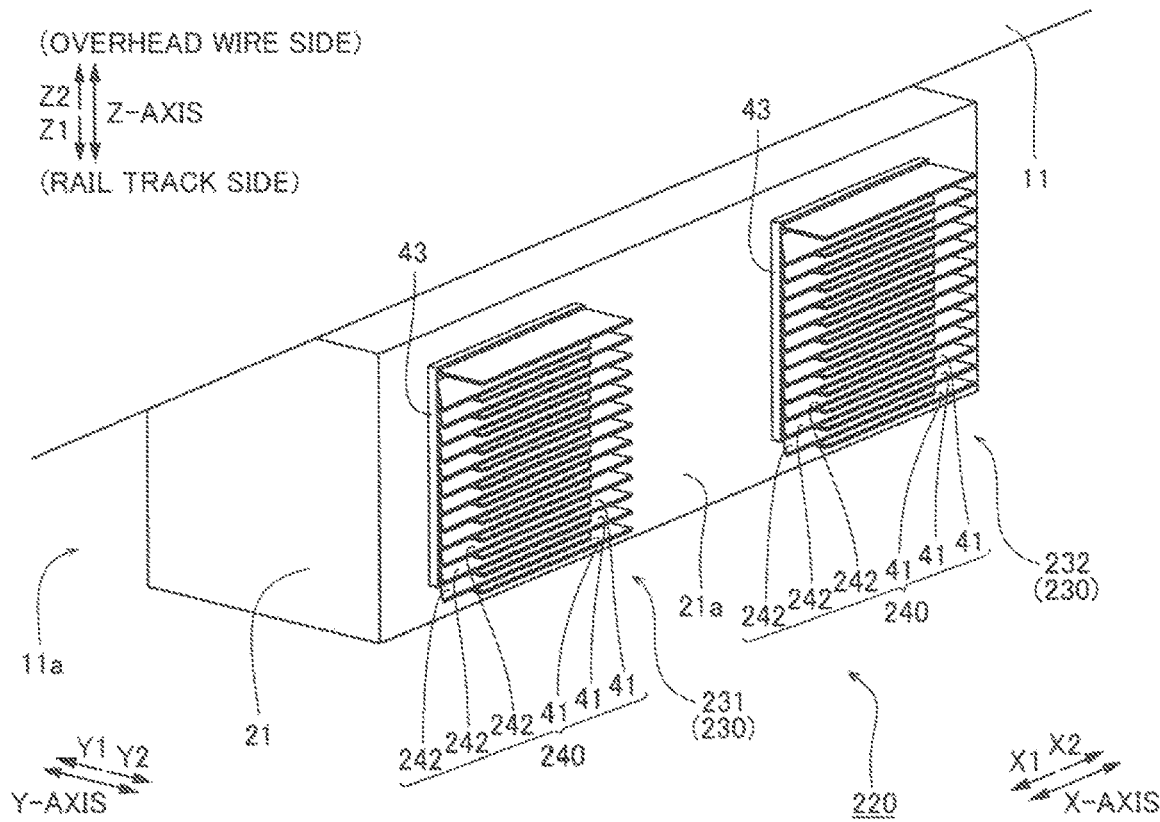

FIG.9
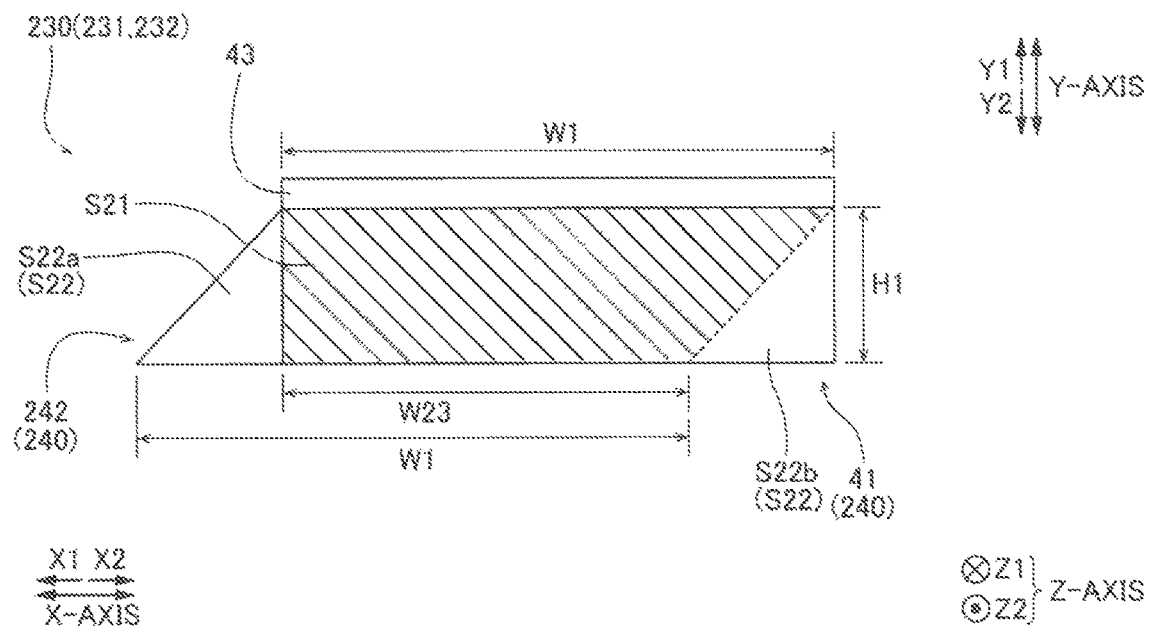
FIG.10 (THIRD MODIFICATION)
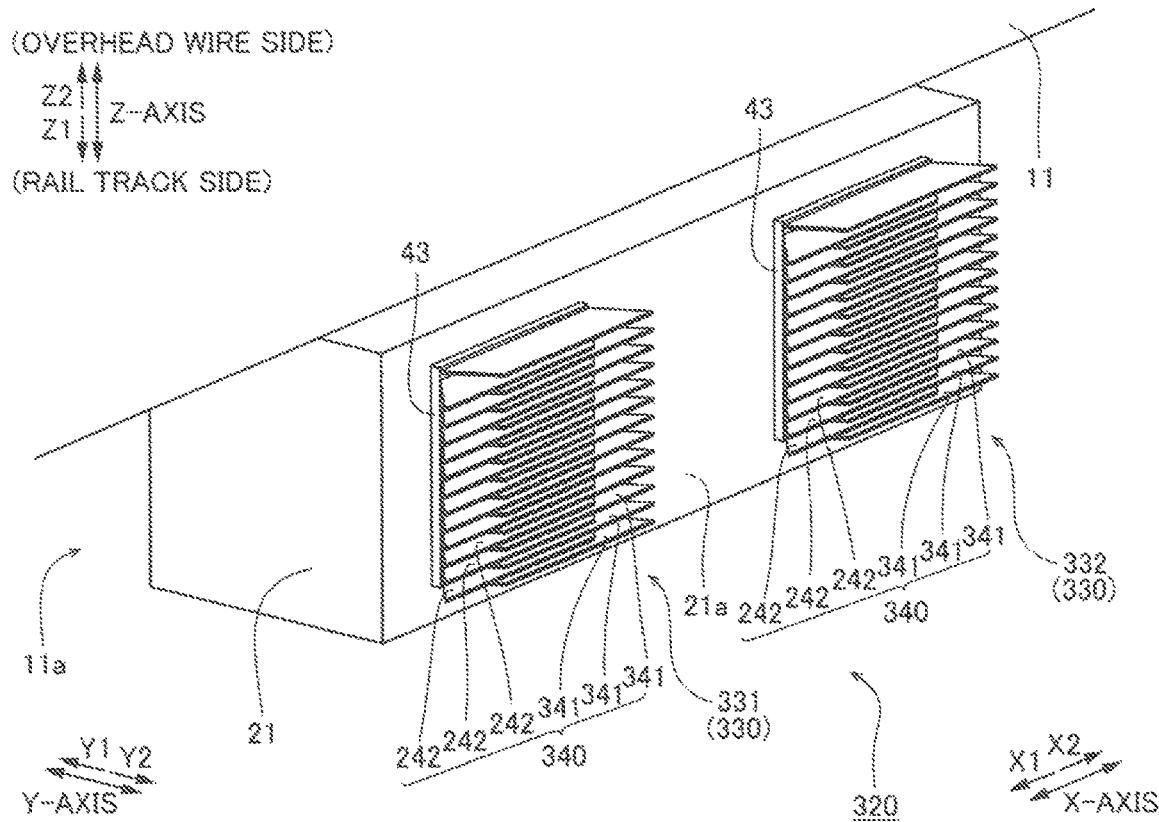

[SECOND EMBODIMENT]

[THIRD EMBODIMENT]

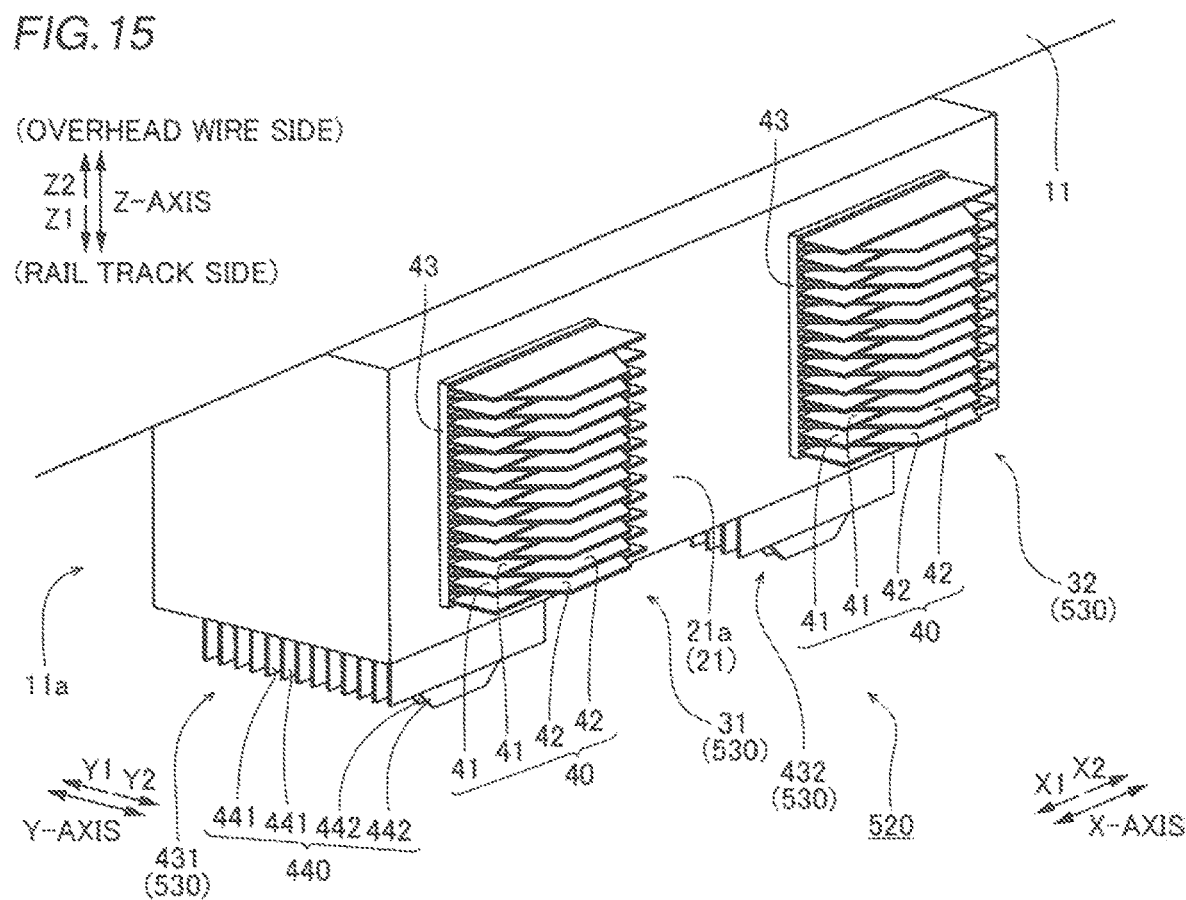

POWER CONVERTER FOR RAILROAD VEHICLE

CROSS-REFERENCE TO RELATED APPLICATION

The priority application number JP2017-060365, Power Converter for Railroad Vehicle, Mar. 27, 2017, Akira Kamiya, Kimihisa Kaneko, and Yoshihisa Uehara, upon which this patent application is based, is hereby incorporated by reference.

BACKGROUND OF THE INVENTION

Field of the Invention

The present invention relates to a power converter for a railroad vehicle, and more particularly, it relates to a power converter for a railroad vehicle including a cooler that radiates the heat of a power converter body mounted on the railroad vehicle when the railroad vehicle is running.

Description of the Background Art

A power converter for a railroad vehicle including a cooler that radiates the heat of a power converter body mounted on the railroad vehicle when the railroad vehicle is running is known in general, as disclosed in Japanese Patent No. 3469475, for example.

Japanese Patent No. 3469475 discloses a power converter for a railroad vehicle including a plurality of coolers in which a plurality of heat radiating fins that radiate heat to the atmosphere are placed on the lateral side of a power converter body. In the power converter for a railroad vehicle described in Japanese Patent No. 3469475, the plurality of plate-like heat radiating fins having different lengths in the protruding direction thereof are disposed at predetermined intervals in an upward-downward direction. Although not explicitly stated in Japanese Patent No. 3469475, on the power converter body side, the lengths of the heat radiating fins in the running direction of the vehicle are conceivably equal to each other, and the heat radiating fins conceivably face each other over the running direction.

However, in the power converter for a railroad vehicle described in Japanese Patent No. 3469475, the plurality of heat radiating fins disposed at the predetermined intervals have the same lengths in the running direction on the power converter body side, and face each other over the running direction such that a distance at which flow path resistance occurs when traveling air passes between the heat radiating fins increases, and the speed of the traveling air is likely to decrease. Thus, in the power converter for a railroad vehicle described in Japanese Patent No. 3469475, the cooling performance of the cooler may disadvantageously deteriorate due to a decrease in the flow speed of the traveling air that passes between the heat radiating fins.

SUMMARY OF THE INVENTION

The present invention has been proposed in order to solve the aforementioned problem, and an object of the present invention is to provide a power converter for a railroad vehicle capable of improving the cooling performance of a cooler by significantly reducing or preventing a decrease in the flow speed of traveling air that passes between heat radiating fins.

A power converter for a railroad vehicle according to an aspect of the present invention includes a power converter body mounted on the railroad vehicle and a cooler that radiates heat of the power converter body, the cooler includes a plurality of fins that extend in a running direction of the railroad vehicle, the plurality of fins include a first fin and a second fin aligned in an alignment direction so as to be adjacent to each other and having outer shapes different from each other as viewed in the alignment direction, on both ends of the first fin and the second fin in the running direction, non-overlapping regions in which the first fin and the second fin do not face each other in the alignment direction are located so as to sandwich an overlapping region, in which the first fin and the second fin face each other in the alignment direction, therebetween, and in the running direction, a length of a base of the overlapping region on a power converter body side is longer than a length of a distal end of the overlapping region on a side opposite to the power converter body side.

As described above, the power converter for a railroad vehicle according to this aspect of the present invention includes the first fin and the second fin having outer shapes different from each other as viewed in the alignment direction, and on both ends of the first fin and the second fin in the running direction, the non-overlapping regions in which the first fin and the second fin do not face each other in the alignment direction are located so as to sandwich the overlapping region, in which the first fin and the second fin face each other in the alignment direction, therebetween. Furthermore, in the running direction, the length of the base of the overlapping region on the power converter body side is longer than the length of the distal end of the overlapping region on the side opposite to the power converter body side. Thus, in the non-overlapping regions in which the first fin and the second fin do not face each other in the alignment direction, a distance between the adjacent fins in the alignment direction increases as compared with the case where only one type of fins having the same length in the running direction is aligned, and hence the flow path resistance of traveling air between the fins in the non-overlapping regions can be decreased. In addition, the non-overlapping regions are located on both ends in the running direction such that the flow path resistance can be effectively decreased particularly at an entrance to between the fins for the traveling air at which the flow path resistance increases. As a result, the cooling performance of the cooler can be improved by reducing a decrease in the flow speed of the traveling air by a decrease in the flow path resistance of the traveling air between the fins in the non-overlapping regions. Moreover, in the overlapping region, the length of the base is longer than the length of the distal end such that the lengths of the bases (portions bonded to a base portion to which the first fin and the second fin are fixed) of both the first fin and the second fin can be increased, and hence bonding strength between the base portion and both the first fin and the second fin can be ensured even when the flow path resistance is decreased by providing the non-overlapping regions on both ends of the first fin and the second fin in the running direction.

In the power converter for a railroad vehicle according to this aspect, the first fin and the second fin are preferably alternately disposed. According to this structure, the largest number of the non-overlapping regions in which the first fin and the second fin do not face each other in the alignment direction can be provided under a condition of providing the same number of fins in the cooler. As a result, the flow path resistance of the traveling air between the fins can be reliably decreased.

In the power converter for a railroad vehicle according to this aspect, at least one of the first fin and the second fin preferably has a polygonal shape different from a rectangular shape as viewed in the alignment direction. According to this structure, the first fin and the second fin have a rectangular shape and a trapezoidal shape, a rectangular shape and a triangular shape, a rectangular shape and a parallelogram shape, or parallelogram shapes opposite to each other as viewed in the alignment direction, respectively, for example such that the first fin and the second fin that have outer shapes different from each other as viewed in the alignment direction and allow formation of the non-overlapping regions can be easily achieved.

In the power converter for a railroad vehicle in which at least one of the first fin and the second fin has a polygonal shape different from a rectangular shape, one of the first fin and the second fin preferably has a rectangular shape as viewed in the alignment direction, and the other of the first fin and the second fin preferably has a trapezoidal shape or a triangular shape as viewed in the alignment direction. According to this structure, one of the first fin and the second fin has a rectangular shape easy to manufacture, and the other of the first fin and the second fin has a trapezoidal shape or a triangular shape having the same base as the rectangular shape to ensure formation of the non-overlapping regions on both sides with respect to the base, and hence the non-overlapping regions in which the first fin and the second fin do not face each other in the alignment direction can be easily located so as to sandwich the overlapping region therebetween.

In the power converter for a railroad vehicle in which one of the first fin and the second fin has a rectangular shape, and the other of the first fin and the second fin has a trapezoidal shape or a triangular shape, a protrusion height of the first fin and a protrusion height of the second fin are preferably different from each other in a protruding direction being perpendicular to the running direction and the alignment direction and in which the plurality of fins protrude. According to this structure, the protrusion height of the first fin or the protrusion height of the second fin is appropriately changed such that the size of the overlapping region can be easily adjusted, and hence it is easy to make the area of the first fin and the area of the second fin substantially equal to each other in the alignment direction, for example. In addition, when the area of the first fin and the area of the second fin are substantially equal to each other in the alignment direction, the heat radiation amount from the first fin and the heat radiation amount from the second fin can be substantially equal to each other. As a result, the surface temperature of the power converter body on the side on which the first fin and the second fin are placed can be easily equalized, and variations in thermal resistance in the power converter body can be significantly reduced or prevented.

In the power converter for a railroad vehicle in which at least one of the first fin and the second fin has a polygonal shape different from a rectangular shape as viewed in the alignment direction, one of the first fin and the second fin preferably has a rectangular shape as viewed in the alignment direction, and the other of the first fin and the second fin preferably has a parallelogram shape as viewed in the alignment direction. According to this structure, one of the first fin and the second fin has a rectangular shape easy to manufacture, and the other of the first fin and the second fin has a parallelogram shape having the same base as the rectangular shape to ensure formation of the non-overlapping regions on both sides with respect to the base, and hence the non-overlapping regions can be easily located on both ends of the first fin and the second fin in the running direction. Furthermore, when the other of the first fin and the second fin has a parallelogram shape having the same base as the rectangular shape, the area of the non-overlapping regions can be increased while the protrusion height is constant (the area of the fin is constant) as compared with the case where the other of the first fin and the second fin has a trapezoidal shape or a triangular shape.

In the power converter for a railroad vehicle in which at least one of the first fin and the second fin has a polygonal shape different from a rectangular shape, the first fin and the second fin each preferably have a parallelogram shape, and an angle defined by the base and an end of the first fin on one side in the running direction is preferably equal to an angle defined by the base and an end of the second fin on the other side in the running direction. According to this structure, the fins each having a parallelogram shape are opposite to each other as viewed in the alignment direction, and hence as compared with the case where one of the first fin and the second fin has a rectangular shape and the other has a parallelogram shape, the non-overlapping regions can be more easily located so as to sandwich the overlapping region therebetween. In addition, the first fin and the second fin have parallelogram shapes opposite to each other as viewed in the alignment direction such that the non-overlapping regions located so as to sandwich the overlapping region therebetween are symmetrical with respect to a centerline that extends in a direction perpendicular to the running direction, and hence as compared with the case where one of the first fin and the second fin has a rectangular shape and the other of the first fin and the second fin has a parallelogram shape such that the non-overlapping regions are not symmetrical, it is possible to equally significantly reduce or prevent a decrease in the flow speed of the traveling air even when the running direction is reversed.

In the power converter for a railroad vehicle in which one of the first fin and the second fin has a rectangular shape and the other of the first fin and the second fin has a parallelogram shape, or the first fin and the second fin each have a parallelogram shape, a protrusion height of the first fin and a protrusion height of the second fin are preferably substantially equal to each other in a protruding direction being perpendicular to the running direction and the alignment direction and in which the plurality of fins protrude. According to this structure, when the length of the base of the first fin and the length of the base of the second fin are equal to each other, for example, the area of the first fin and the area of the second fin can be substantially equal to each other in the alignment direction, and hence the heat radiation amount from the first fin and the heat radiation amount from the second fin can be substantially equal to each other. As a result, the surface temperature of the power converter body on the side on which the first fin and the second fin are placed can be easily equalized, and variations in thermal resistance in the power converter body can be significantly reduced or prevented.

In the power converter for a railroad vehicle according to this aspect, the cooler is preferably placed in an underfloor space of the railroad vehicle, and the plurality of fins provided in the cooler preferably protrude laterally of the railroad vehicle. According to this structure, when a space for placing the cooler is sufficient on the lateral side of the power converter body, the cooler, the cooling performance of which can be improved by significantly reducing or preventing a decrease in the flow speed of the traveling air, can be easily placed. Furthermore, the cooler is provided laterally of the power converter body such that the cooler is exposed to the lateral side of the railroad vehicle when the railroad vehicle is running. Thus, less turbulent traveling air can be incorporated as compared with the case where the traveling air is incorporated from the lower side of the railroad vehicle on which many other devices etc. are mounted, and hence the traveling air from the lateral side of the railroad vehicle can be easily incorporated by the cooler. As a result, the cooling performance (heat radiation performance) of the cooler can be further improved.

In the power converter for a railroad vehicle according to this aspect, the cooler is preferably placed in an underfloor space of the railroad vehicle, and the plurality of fins provided in the cooler preferably protrude downwardly of the railroad vehicle. According to this structure, when a space for placing the cooler is sufficient under the power converter body, the cooler, the cooling performance of which can be improved by significantly reducing or preventing a decrease in the flow speed of the traveling air, can be easily placed.

In the power converter for a railroad vehicle according to this aspect, the cooler preferably includes a first cooler and a second cooler disposed at a predetermined interval in the running direction, and each of the first cooler and the second cooler preferably includes the first fin and the second fin. According to this structure, the traveling air, in which a decrease in its flow speed is significantly reduced or prevented by upstream one of the first cooler and the second cooler, is incorporated into downstream one of the first cooler and the second cooler, and a decrease in the flow speed in the downstream cooler is also significantly reduced or prevented, and hence the cooling performance of both the upstream cooler and the downstream cooler can be improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a side elevational view showing a railroad vehicle according to a first embodiment of the present invention;

FIG. 2 is a perspective view showing coolers of a power converter according to the first embodiment of the present invention;

FIG. 7 is an enlarged plan view showing one of the coolers of the power converter according to the first modification of the first embodiment of the present invention;

FIG. 8 is a perspective view showing coolers of a power converter according to a second modification of the first embodiment of the present invention;

FIG. 9 is an enlarged plan view showing one of the coolers of the power converter according to the second modification of the first embodiment of the present invention;

FIG. 10 is a perspective view showing coolers of a power converter according to a third modification of the first embodiment of the present invention;

FIG. 15 is a perspective view showing coolers of a power converter according to the third embodiment of the present invention.

DESCRIPTION OF THE PREFERRED EMBODIMENTS

Figure 3:
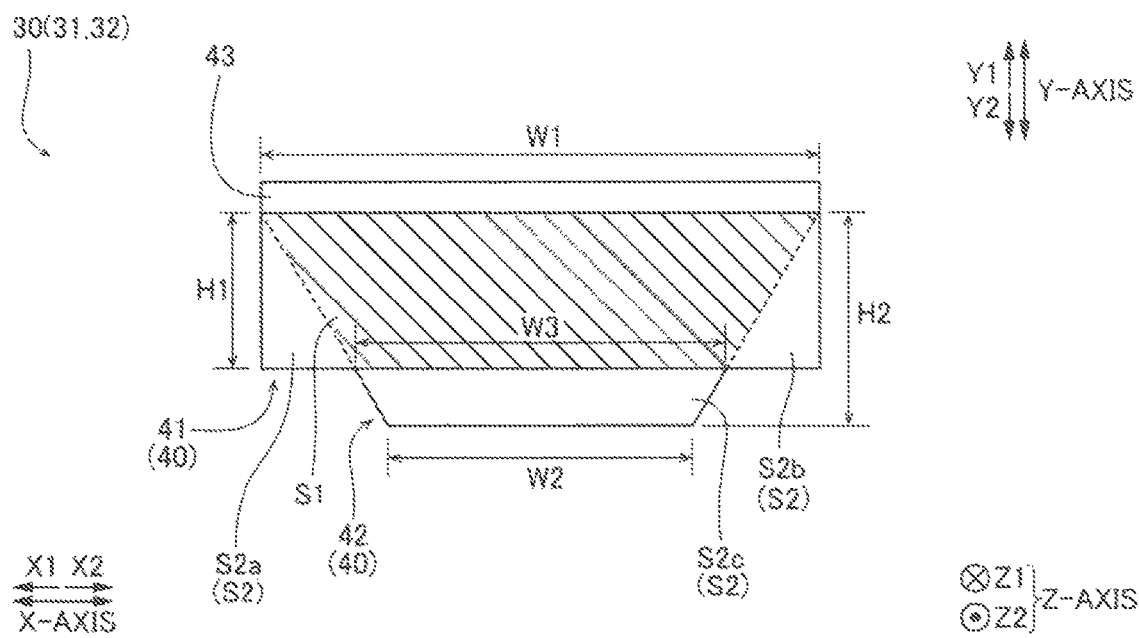
FIG. 3 is an enlarged plan view showing one of the coolers of the power converter according to the first embodiment of the present invention.

Embodiments of the present invention are hereinafter described with reference to the drawings.

First Embodiment

The structure of a power converter 20 for a railroad vehicle 10 according to a first embodiment of the present invention is now described with reference to FIGS. 1 to 3. The power converter 20 is an example of a "power converter for a railroad vehicle" in the claims. In the following description, the running direction of the railroad vehicle 10 is set as an X-axis direction, the direction of crossties perpendicular to the X-axis direction is set as a Y-axis direction, and an upward-downward direction perpendicular to both the X-axis direction and the Y-axis direction is set as a Z-axis direction.

The power converter 20 according to the first embodiment of the present invention is placed in an underfloor space 11a of a vehicle body 11 of the railroad vehicle 10, as shown in FIGS. 1 and 2. The schematic structure of the railroad vehicle 10 is now described briefly. The railroad vehicle 10 includes the vehicle body 11, a pantograph 12 that receives (collects) electric power supplied to an overhead wire 2, induction motors 14 (shown by broken lines) that rotate drive wheels 13 using the electric power from the overhead wire 2, and a plurality of other devices 15 such as an air conditioner and a controller, as shown in FIG. 1. The power converter 20 has a function of converting the electric power from the overhead wire 2 by switching of a semiconductor element (not shown) and controlling rotation of the induction motors 14 when the railroad vehicle 10 is running.

(Structure of Power Converter)

The power converter 20 includes a semiconductor device 21 that performs power conversion and a plurality of coolers 30 that radiate heat generated from the semiconductor element in the semiconductor device 21 to outside air. As shown in FIG. 2, the power converter 20 is hung on and fixed to the lower surface 11b of the vehicle body 11 in the underfloor space 11a of the vehicle body 11. In the power converter 20, the plurality of coolers 30 are disposed laterally (in a direction Y2) of the semiconductor device 21. The plurality of coolers 30 include a cooler 31 on an X1 side and a cooler 32 on an X2 side, which are disposed at a predetermined interval in the X-axis direction in which the vehicle body 11 extends. The semiconductor device 21 is an example of a "power converter body" in the claims. The cooler 31 and the cooler 32 are examples of a "first cooler" and a "second cooler" in the claims, respectively.

(Structure of Cooler)

Each of the cooler 31 and the cooler 32 includes a plurality of fins 40 that protrude laterally (in the direction Y2) from the side surface 21a of the semiconductor device 21 on a Y2 side and extend in a thin plate shape along the X-axis direction. As shown in FIG. 2, the plurality of fins 40 have outer shapes different from each other as viewed in the Z-axis direction, and include a plurality of fins 41 and a plurality of fins 42 that protrude in the Y-axis direction. The fins 41 and the fins 42 are adjacent to each other so as to be alternately aligned in the Z-axis direction with a predetermined fin pitch. That is, the plurality of fins 41 and the plurality of fins 42 are disposed adjacent to each other in the Z-axis direction. Furthermore, the fins 41 and the fins 42 are fixed on the surfaces of flat heat receiving plates 43 on the Y2 side. The heat generated from the semiconductor element and transferred through the heat receiving plates 43 is released from the fins 41 and the fins 42. In the following description, the Z-axis direction in which the plurality of fins 41 and the plurality of fins 42 are aligned may be referred to as an "alignment direction" in some cases.

As shown in FIG. 3, the fins 41 each have a length W1 in the X-axis direction and a length (protrusion height) H1 in the Y-axis direction, and have a rectangular shape as viewed in the Z-axis direction. The fins 42 each include a base having a length W1 on the semiconductor device 21 side (Y1 side) in the Y-axis direction and a distal end having a length W2 on the side (Y2 side) opposite to the semiconductor device 21 side in the Y-axis direction, have a length (protrusion height) H2 in the Y-axis direction, and have a trapezoidal shape as viewed in the Z-axis direction. That is, the length W1 of the base of the fin 41 on the semiconductor device 21 side is equal to the length W1 of the base of the fin 42 on the semiconductor device 21 side. In addition, either the fins 41 or the fins 42 (the fins 42, for example) each have a polygonal shape different from a rectangular shape as viewed in the Z-axis direction. In the power converter 20 according to the first embodiment, the area of each of the fins 41 is substantially equal to the area of each of the fins 42 as viewed in the Z-axis direction. The bases of the fins 41 on the semiconductor device 21 side and the bases of the fins 42 on the semiconductor device 21 side are disposed so as not to be shifted with respect to each other in the X-axis direction.

In the fins 42, the length W1 of the base is longer than the length W2 of the distal end. The protrusion height H1 of each of the fins 41 in the Y-axis direction is smaller than the protrusion height H2 of each of the fins 42 in the Y-axis direction. That is, the protrusion height H1 of the fin 41 and the protrusion height H2 of the fin 42 are different from each other in a protruding direction in which the fin 41 and the fin 42 protrude.

With the structure described above, in the power converter 20 according to the first embodiment, an overlapping region S1 in which the fins 41 and the fins 42 face each other and non-overlapping regions S2 in which the fins 41 and the fins 42 do not face each other are located as viewed in the Z-axis direction. The overlapping region S1 is a hatched region in the drawings.

The overlapping region S1 includes a base having a length W1 on the semiconductor device 21 side (Y1 side) in the Y-axis direction and a distal end having a length W3 on the side (Y2 side) opposite to the semiconductor device 21 side in the Y-axis direction, and has a trapezoidal shape as viewed in the Z-axis direction. The length W1 of the base of the overlapping region S1 is equal to the length W1 of the base of each of the fins 41 and the fins 42 and is longer than the length W3 of the distal end of the overlapping region S1.

The non-overlapping regions S2 include non-overlapping regions S2a and S2b located on a first side (X1 side) and a second side (X2 side) of each of the fins 41 in the X-axis direction, respectively, so as to sandwich the overlapping region S1 therebetween in the X-axis direction and a non-overlapping region S2c located on the Y2 side with respect to the overlapping region S1.

Thus, in the non-overlapping regions S2a and S2b, the fins 41 are adjacent to each other in the Z-axis direction, and a distance between the fins 40 is twice the predetermined fin pitch. Therefore, in the non-overlapping regions S2a and S2b, the distance between the fins 40 is larger than in the overlapping region S1, and hence flow path resistance that occurs when traveling air passes between the fins 40 decreases.

In the power converter 20 according to the first embodiment, the area of each of the fins 41 is substantially equal to the area in each of the fins 42, and hence the sum of the area of the non-overlapping region S2a and the area of the non-overlapping region S2b in each of the fins 41 is substantially equal to the area of the non-overlapping region S2c in each of the fins 42.

Example

Results of calculation of the flow speed of the traveling air and the cooling performance of the coolers by thermal fluid analysis when the railroad vehicle 10 is running in a direction X1 in the power converter 20 according to the first embodiment are now described.

Figure 4:
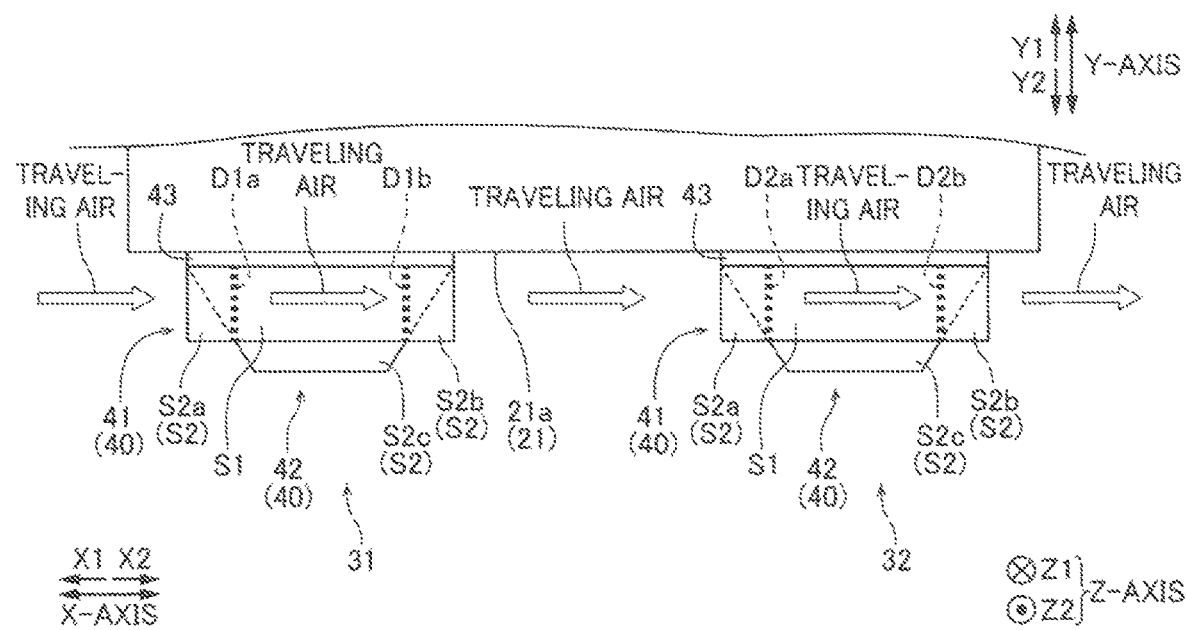
FIG. 4 illustrates measurement of the flow speed of traveling air in the coolers of the power converter according to the first embodiment of the present invention.

As shown in FIG. 4, the flow speed of the traveling air was calculated on the cross-section D1a and the cross-section D1b of each of the fins 41 in a YZ plane and the cross-section D2a and the cross-section D2b of each of the fins 42 in the YZ plane. The cross-section D1a and the cross-section D2a are in the vicinity of an end of the non-overlapping region S2a on the X1 side, and the cross-section D1b and the cross-section D2b are in the vicinity of an end of the non-overlapping region S2b on the X2 side. That is, the average speed (a value obtained by dividing a volume flow rate on each cross-section by its cross-sectional area) of the traveling air was calculated in the vicinity of an entrance and the vicinity of an exit of the cooler 31 on the upstream side of the traveling air and in the vicinity of an entrance and the vicinity of an exit of the cooler 32 on the downstream side of the traveling air. The flow speed of the traveling air in the case where all of the fins 40 were rectangular (the shape of the fins 41) was also calculated as a comparative example.

Figure 5:
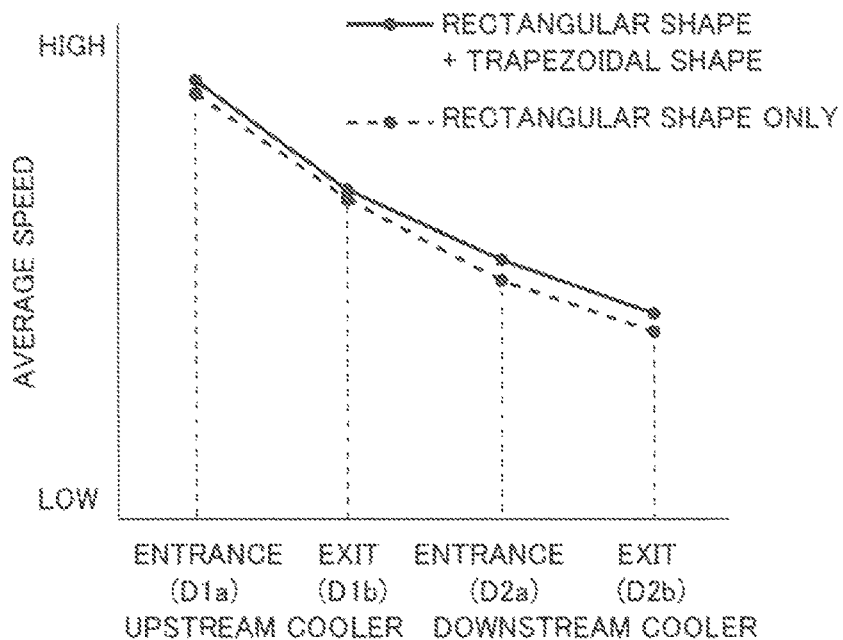
FIG. 5 is a diagram for comparing the flow speed of the traveling air in the coolers of the power converter according to the first embodiment of the present invention and the flow speed of traveling air in coolers of a power converter according to a conventional example.

FIG. 5 shows the average speed of the traveling air on the cross-section D1a, the cross-section D1b, the cross-section D2a, and the cross-section D2b. On any of the cross-section D1a, the cross-section D1b, the cross-section D2a, and the cross-section D2b, the average speed of the traveling air between the fins 40 including the rectangular fins 41 and the trapezoidal fins 42 (in the power converter 20 according to the first embodiment) was larger than the average speed of the traveling air between the fins 40 including only the rectangular fins 41. This is conceivably because the flow path resistance between the fins 40 decreased such that a decrease in the speed of the traveling air was significantly reduced or prevented. When the semiconductor device 21 was generating heat, the heat radiation performance of the coolers 30 was measured, and it has been confirmed that the temperature rise of the semiconductor device 21 can be decreased by about 10% as compared with the comparative example.

(Effects of First Embodiment)

According to the first embodiment, the following effects can be obtained.

As described above, the power converter 20 according to the first embodiment includes the fins 41 and the fins 42 having outer shapes different from each other as viewed in the alignment direction (Z-axis direction), and on both ends (ends on the X1 side and the X2 side) of the fins 41 and the fins 42 in the running direction (X-axis direction), the non-overlapping regions S2 in which the fins 41 and the fins 42 do not face each other in the alignment direction are located so as to sandwich the overlapping region S1, in which the fins 41 and the fins 42 face each other in the alignment direction, therebetween. Furthermore, in the running direction, the length W1 of the base of the overlapping region S1 on the semiconductor device 21 side is longer than the length W3 of the distal end of the overlapping region S1 on the side opposite to the semiconductor device 21 side. Thus, in the non-overlapping regions S2 in which the fins 41 and the fins 42 do not face each other in the alignment direction, the distance between the adjacent fins 40 in the alignment direction increases as compared with the case where only one type of fins 40 having the same length in the running direction is aligned, and hence the flow path resistance of the traveling air between the fins 40 in the non-overlapping regions S2 can be decreased. In addition, the non-overlapping regions S2 (S2a and S2b) are located on both ends in the running direction such that the flow path resistance can be effectively decreased particularly at an entrance to between the fins 40 for the traveling air at which the flow path resistance increases. As a result, the cooling performance of the coolers 30 can be improved by reducing a decrease in the flow speed of the traveling air by a decrease in the flow path resistance of the traveling air between the fins 40 in the non-overlapping regions S2. Moreover, in the overlapping region S1, the length W1 of the base is longer than the length W3 of the distal end such that the lengths of the bases (portions bonded to the heat receiving plates 43) of both the fins 41 and the fins 42 can be increased, and hence bonding strength between the heat receiving plates 43 and both the fins 41 and the fins 42 can be ensured even when the flow path resistance is decreased by providing the non-overlapping regions S2 on both ends of the fins 41 and the fins 42 in the running direction.

In the power converter 20 according to the first embodiment, as described above, the fins 41 and the fins 42 are alternately disposed. Thus, the largest number of the non-overlapping regions S2 in which the fins 41 and the fins 42 do not face each other in the alignment direction (Z-axis direction) can be provided under a condition of providing the same number of fins 40 in the coolers 30. As a result, the flow path resistance of the traveling air between the fins 40 can be reliably decreased.

In the power converter 20 according to the first embodiment, as described above, at least either the fins 41 or the fins 42 (the fins 42, for example) each have a polygonal shape (trapezoidal shape) different from a rectangular shape as viewed in the alignment direction (Z-axis direction). Thus, the fins 41 and the fins 42 are rectangular and trapezoidal, respectively, such that the fins 41 and the fins 42 that have outer shapes different from each other as viewed in the alignment direction and allow formation of the non-overlapping regions S2 can be easily achieved.

In the power converter 20 according to the first embodiment, ones (fins 41) of the fins 41 and the fins 42 each have a rectangular shape as viewed in the alignment direction (Z-axis direction), and the others (fins 42) of the fins 41 and the fins 42 each have a trapezoidal shape as viewed in the alignment direction. Thus, ones (fins 41) of the fins 41 and the fins 42 each have a rectangular shape easy to manufacture, and the others (fins 42) of the fins 41 and the fins 42 each have a trapezoidal shape having the same base as the rectangular shape to ensure formation of the non-overlapping regions S2 on both sides with respect to the base, and hence the non-overlapping regions S2 in which the fins 41 and the fins 42 do not face each other in the alignment direction can be easily located so as to sandwich the overlapping region S1 therebetween.

In the power converter 20 according to the first embodiment, as described above, the protrusion height H1 of each of the fins 41 and the protrusion height H2 of each of the fins 42 are different from each other in the protruding direction (Y-axis direction) being perpendicular to the running direction (X-axis direction) and the alignment direction (Z-axis direction) and in which the plurality of fins 40 protrude. Thus, the protrusion height H1 of each of the fins 41 or the protrusion height H2 of each of the fins 42 is appropriately changed such that the size of the overlapping region S1 can be easily adjusted, and hence it is easy to make the area of the fins 41 and the area of the fins 42 substantially equal to each other in the alignment direction. In addition, when the area of the fins 41 and the area of the fins 42 are substantially equal to each other in the alignment direction, the heat radiation amount from the fins 41 and the heat radiation amount from the fins 42 can be substantially equal to each other. As a result, the surface temperature of the semiconductor device 21 on the side on which the fins 41 and the fins 42 are placed can be easily equalized, and variations in thermal resistance in the semiconductor device 21 can be significantly reduced or prevented.

In the power converter 20 according to the first embodiment, as described above, the coolers 30 are placed in the underfloor space of the railroad vehicle 10, and the plurality of fins 40 provided in the coolers 30 protrude laterally (in the direction Y2) of the railroad vehicle 10. Thus, when the space for placing the coolers 30 is sufficient on the lateral side of the semiconductor device 21, the coolers 30, the cooling performance of which can be improved by significantly reducing or preventing a decrease in the flow speed of the traveling air, can be easily placed. Furthermore, the coolers 30 are provided laterally of the semiconductor device 21 such that the coolers 30 are exposed to the lateral side of the railroad vehicle 10 when the railroad vehicle 10 is running. Thus, less turbulent traveling air can be incorporated as compared with the case where the traveling air is incorporated from the lower side of the railroad vehicle 10 on which many other devices etc. are mounted, and hence the traveling air from the lateral side of the railroad vehicle 10 can be easily incorporated by the coolers 30. As a result, the cooling performance (heat radiation performance) of the coolers 30 can be further improved.

In the power converter 20 according to the first embodiment, as described above, the coolers 30 include the cooler 31 and the cooler 32 disposed at the predetermined interval in the running direction (X-axis direction), and each of the cooler 31 and the cooler 32 includes the fins 41 and the fins 42. Thus, the traveling air, in which a decrease in its flow speed is significantly reduced or prevented by upstream one of the cooler 31 and the cooler 32, is incorporated into downstream one of the cooler 31 and the cooler 32, and a decrease in the flow speed in the downstream cooler 30 is also significantly reduced or prevented, and hence the cooling performance of both the upstream cooler 30 and the downstream cooler 30 can be improved.

(First Modification of First Embodiment)

A first modification of the first embodiment is now described with reference to FIGS. 6 and 7. According to the first modification of the first embodiment, triangular fins 142 are provided instead of the trapezoidal fins 42 according to the first embodiment. In the figures, the same structures as those of the first embodiment are denoted by the same reference numerals.

Figure 6:
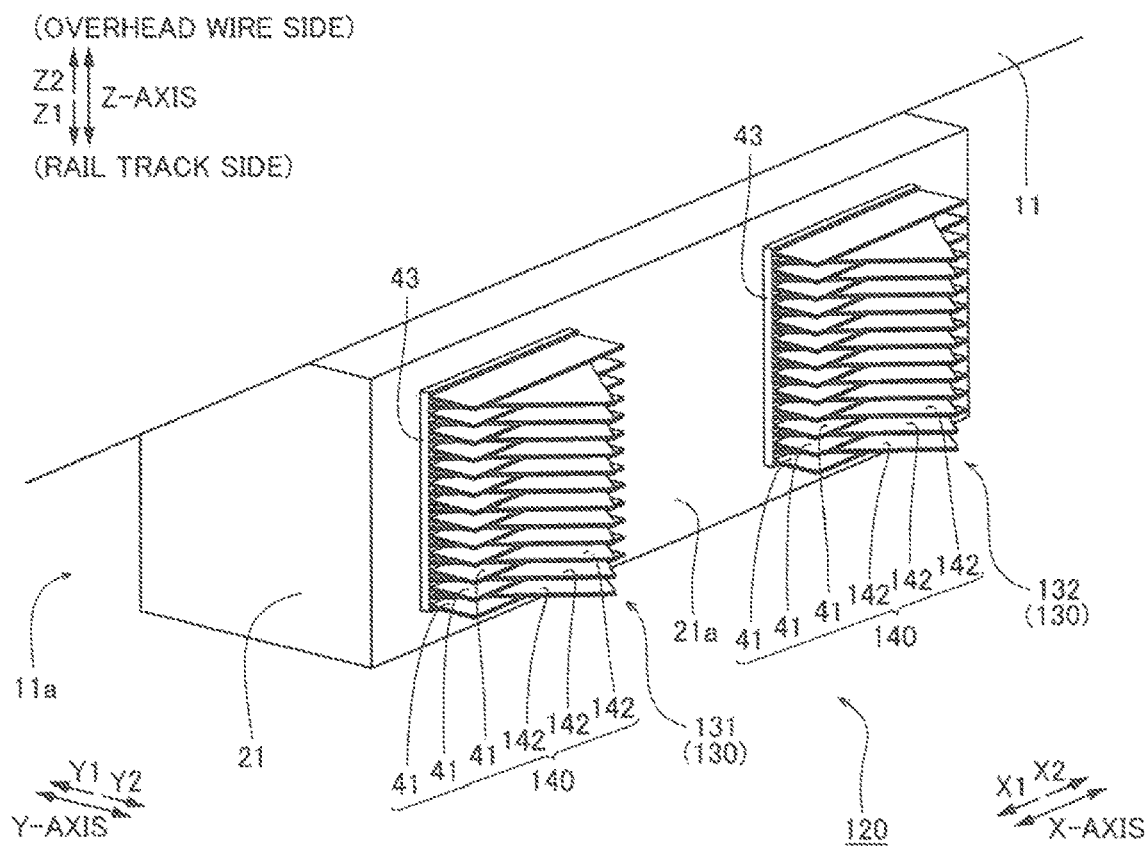
FIG. 6 is a perspective view showing coolers of a power converter according to a first modification of the first embodiment of the present invention.

As shown in FIG. 6, in a power converter 120 according to the first modification of the first embodiment, a plurality of coolers 130 are disposed laterally (in a direction Y2) of a semiconductor device 21. The plurality of coolers 130 include a cooler 131 on an X1 side and a cooler 132 on an X2 side, which are disposed at a predetermined interval in an X-axis direction. The cooler 131 and the cooler 132 are examples of a "first cooler" and a "second cooler" in the claims, respectively.

Each of the cooler 131 and the cooler 132 includes a plurality of fins 140 that protrude laterally (in the direction Y2) from the side surface 21a of the semiconductor device 21 on a Y2 side. As shown in FIG. 6, the plurality of fins 140 include a plurality of fins 41 and a plurality of fins 142 that have outer shapes different from each other as viewed in a Z-axis direction and protrude in a Y-axis direction. The fins 41 and the fins 142 are adjacent to each other so as to be alternately aligned in the Z-axis direction with a predetermined fin pitch.

As shown in FIG. 7, the fins 142 each include a base having a length W1 on the semiconductor device 21 side (Y1 side) in the Y-axis direction, have a length (protrusion height) H2 in the Y-axis direction, and have a triangular shape (isosceles triangular shape) as viewed in the Z-axis direction. That is, either the fins 41 or the fins 142 (the fins 142, for example) each have a polygonal shape different from a rectangular shape as viewed in the Z-axis direction. In the power converter 120 according to the first modification of the first embodiment, the area of each of the fins 41 is substantially equal to the area of each of the fins 142 as viewed in the Z-axis direction.

The protrusion height H1 of each of the fins 41 in the Y-axis direction is lower than the protrusion height H12 of each of the fins 142 in the Y-axis direction. That is, the protrusion height H1 of the fin 41 and the protrusion height H12 of the fin 142 are different from each other in a protruding direction in which the fin 41 and the fin 142 protrude.

With the structure described above, in the power converter 120 according to the first modification of the first embodiment, an overlapping region S11 in which the fins 41 and the fins 142 face each other and non-overlapping regions S12 in which the fins 41 and the fins 142 do not face each other are located as viewed in the Z-axis direction. The overlapping region S11 is a hatched region in the drawings.

The overlapping region S11 includes a base having a length W1 on the semiconductor device 21 side (Y1 side) in the Y-axis direction and a distal end having a length W13 on the side (Y2 side) opposite to the semiconductor device 21 side in the Y-axis direction, and has a trapezoidal shape as viewed in the Z-axis direction. The length W1 of the base of the overlapping region S11 is equal to the length W1 of the base of each of the fins 41 and the fins 142 and is longer than the length W13 of the distal end of the overlapping region S11.

The non-overlapping regions S12 include non-overlapping regions S12a and S12b located on a first side (X1 side) and a second side (X2 side) of each of the fins 41 in the X-axis direction, respectively, so as to sandwich the overlapping region S11 therebetween in the X-axis direction and a non-overlapping region S12c located on the Y2 side with respect to the overlapping region S11.

Thus, in the non-overlapping regions S12a and S12b, the fins 41 are adjacent to each other in the Z-axis direction, and a distance between the fins 140 is twice the predetermined fin pitch. Therefore, in the non-overlapping regions S12a and S12b, the distance between the fins 140 is larger than in the overlapping region S11, and hence flow path resistance that occurs when traveling air passes between the fins 140 decreases.

In the power converter 120 according to the first modification of the first embodiment, the area of each of the fins 41 and the area of each of the fins 142 are substantially equal to each other, and hence the sum of the area of the non-overlapping region S12a and the area of the non-overlapping region S12b in each of the fins 41 is substantially equal to the area of the non-overlapping region S12c in each of the fins 142.

The remaining structures of the first modification of the first embodiment are similar to those of the first embodiment.

In the power converter 120 according to the first modification of the first embodiment, as described above, ones (fins 41) of the fins 41 and the fins 142 each have a rectangular shape as viewed in an alignment direction (Z-axis direction), and the others (fins 142) of the fins 41 and the fins 142 each have a triangular shape as viewed in the alignment direction. Thus, ones (fins 41) of the fins 41 and the fins 142 each have a rectangular shape easy to manufacture, and the others (fins 142) of the fins 41 and the fins 142 each have a triangular shape having the same base as the rectangular shape to ensure formation of the non-overlapping regions S12 on both sides with respect to the base, and hence the non-overlapping regions S12 in which the fins 41 and the fins 142 do not face each other in the alignment direction can be easily located so as to sandwich the overlapping region S11 therebetween.

The remaining effects of the first modification of the first embodiment are similar to those of the first embodiment.

(Second Modification of First Embodiment)

A second modification of the first embodiment is now described with reference to FIGS. 8 and 9. According to the second modification of the first embodiment, parallelogram fins 242 are provided instead of the trapezoidal fins 42 according to the first embodiment. In the figures, the same structures as those of the first embodiment are denoted by the same reference numerals.

In a power converter 220 according to the second modification of the first embodiment, a plurality of coolers 230 are disposed laterally (in a direction Y2) of a semiconductor device 21. The plurality of coolers 230 include a cooler 231 on an X1 side and a cooler 232 on an X2 side, which are disposed at a predetermined interval in an X-axis direction. The cooler 231 and the cooler 232 are examples of a "first cooler" and a "second cooler" in the claims, respectively.

Each of the cooler 231 and the cooler 232 includes a plurality of fins 240 that protrude laterally (in the direction Y2) from the side surface 21a of the semiconductor device 21 on a Y2 side. As shown in FIG. 8, the plurality of fins 240 include a plurality of fins 41 and a plurality of fins 242 that have outer shapes different from each other as viewed in a Z-axis direction and protrude in a Y-axis direction. The fins 41 and the fins 242 are adjacent to each other so as to be alternately aligned in the Z-axis direction with a predetermined fin pitch.

As shown in FIG. 9, the fins 242 each include a base having a length W1 on the semiconductor device 21 side (Y1 side) in the Y-axis direction and a distal end having a length W1 on the side (Y2 side) opposite to the semiconductor device 21 side in the Y-axis direction, have a length (protrusion height) H1 in the Y-axis direction, and have a parallelogram shape as viewed in the Z-axis direction. That is, either the fins 41 or the fins 242 (the fins 242, for example) each have a polygonal shape different from a rectangular shape as viewed in the Z-axis direction. In the power converter 220 according to the second modification of the first embodiment, the area of each of the fins 41 is substantially equal to the area of each of the fins 242 as viewed in the Z-axis direction.

The protrusion height H1 of each of the fins 41 in the Y-axis direction is substantially equal to the protrusion height H1 of each of the fins 142 in the Y-axis direction.

With the structure described above, in the power converter 220 according to the second modification of the first embodiment, an overlapping region S21 in which the fins 41 and the fins 242 face each other and non-overlapping regions S22 in which the fins 41 and the fins 242 do not face each other are located as viewed in the Z-axis direction. The overlapping region S21 is a hatched region in the drawings.

The overlapping region S21 includes a base having a length W1 on the semiconductor device 21 side (Y1 side) in the Y-axis direction and a distal end having a length W23 on the side (Y2 side) opposite to the semiconductor device 21 side in the Y-axis direction, and has a trapezoidal shape as viewed in the Z-axis direction. The length W1 of the base of the overlapping region S21 is equal to the length W1 of the base of each of the fins 41 and the fins 242 and is longer than the length W23 of the distal end of the overlapping region S21.

The non-overlapping regions S22 include a non-overlapping region S22a and a non-overlapping region S22b located on a first side (X1 side) and a second side (X2 side) of each of the fins 41 in the X-axis direction, respectively, so as to sandwich the overlapping region S21 therebetween in the X-axis direction.

Thus, in the non-overlapping region S22a and the non-overlapping region S22b, the fins 242 are adjacent to each other in the Z-axis direction, the fins 41 are adjacent to each other in the Z-axis direction, and a distance between the fins 240 is twice the predetermined fin pitch. Therefore, in the non-overlapping regions S22, the distance between the fins 240 is larger than in the overlapping region S21, and hence flow path resistance that occurs when traveling air passes between the fins 240 decreases.

In the power converter 220 according to the second modification of the first embodiment, the area of each of the fins 41 and the area of each of the fins 242 are substantially equal to each other, and hence the area of the non-overlapping region S22a in each of the fins 242 is substantially equal to the area of the non-overlapping region S22b in each of the fins 41.

The remaining structures of the second modification of the first embodiment are similar to those of the first embodiment.

In the power converter 220 according to the second modification of the first embodiment, as described above, ones (fins 41) of the fins 41 and the fins 242 each have a rectangular shape as viewed in an alignment direction (Z-axis direction), and the others (fins 242) of the fins 41 and the fins 242 each have a parallelogram shape as viewed in the alignment direction. Thus, ones (fins 41) of the fins 41 and the fins 242 each have a rectangular shape easy to manufacture, and the others (fins 242) of the fins 41 and the fins 242 each have a parallelogram shape having the same base as the rectangular shape to ensure formation of the non-overlapping regions S22 on both sides with respect to the base, and hence the non-overlapping regions S22 can be easily located on both ends of the fins 41 and the fins 242 in a running direction (X-axis direction). Furthermore, when the others (fins 242) of the fins 41 and the fins 242 each have a parallelogram shape having the same base as the rectangular shape, the area of the non-overlapping regions S22 can be increased while the protrusion height H1 is constant (the area of the fins is constant) as compared with the case where the others (fins 242) of the fins 41 and the fins 242 each have a trapezoidal shape or a triangular shape.

In the power converter 220 according to the second modification of the first embodiment, as described above, the protrusion height H1 of each of the fins 41 and the protrusion height H1 of each of the fins 242 are substantially equal to each other in a protruding direction (Y-axis direction) being perpendicular to the running direction (X-axis direction) and the alignment direction (Z-axis direction) and in which the plurality of fins 240 protrude. Thus, the length W1 of the base of each of the fins 41 and the length W1 of the base of each of the fins 242 are equal to each other such that the area of each of the fins 41 and the area of each of the fins 242 can be substantially equal to each other in the alignment direction, and hence the heat radiation amount from the fins 41 and the heat radiation amount from the fins 242 can be substantially equal to each other. As a result, the surface temperature of the semiconductor device 21 on the side on which the fins 41 and the fins 242 are placed can be easily equalized, and variations in thermal resistance in the semiconductor device 21 can be significantly reduced or prevented.

The remaining effects of the second modification of the first embodiment are similar to those of the first embodiment.

(Third Modification of First Embodiment)

A third modification of the first embodiment is now described with reference to FIGS. 10 and 11. According to the third modification of the first embodiment, parallelogram fins 341 are provided instead of the rectangular fins 41 according to the second modification of the first embodiment. In the figures, the same structures as those of the first embodiment and the second modification of the first embodiment are denoted by the same reference numerals.

In a power converter 320 according to the third modification of the first embodiment, a plurality of coolers 330 are disposed laterally (in a direction Y2) of a semiconductor device 21. The plurality of coolers 330 include a cooler 331 on an X1 side and a cooler 332 on an X2 side, which are disposed at a predetermined interval in an X-axis direction. The cooler 331 and the cooler 332 are examples of a "first cooler" and a "second cooler" in the claims, respectively.

Each of the cooler 331 and the cooler 332 includes a plurality of fins 340 that protrude laterally (in the direction Y2) from the side surface 21a of the semiconductor device 21 on a Y2 side. As shown in FIG. 10, the plurality of fins 340 include a plurality of fins 341 and a plurality of fins 242 that have outer shapes different from each other as viewed in a Z-axis direction and protrude in a Y-axis direction. The fins 341 and the fins 242 are adjacent to each other so as to be alternately aligned in the Z-axis direction with a predetermined fin pitch.

Figure 11:
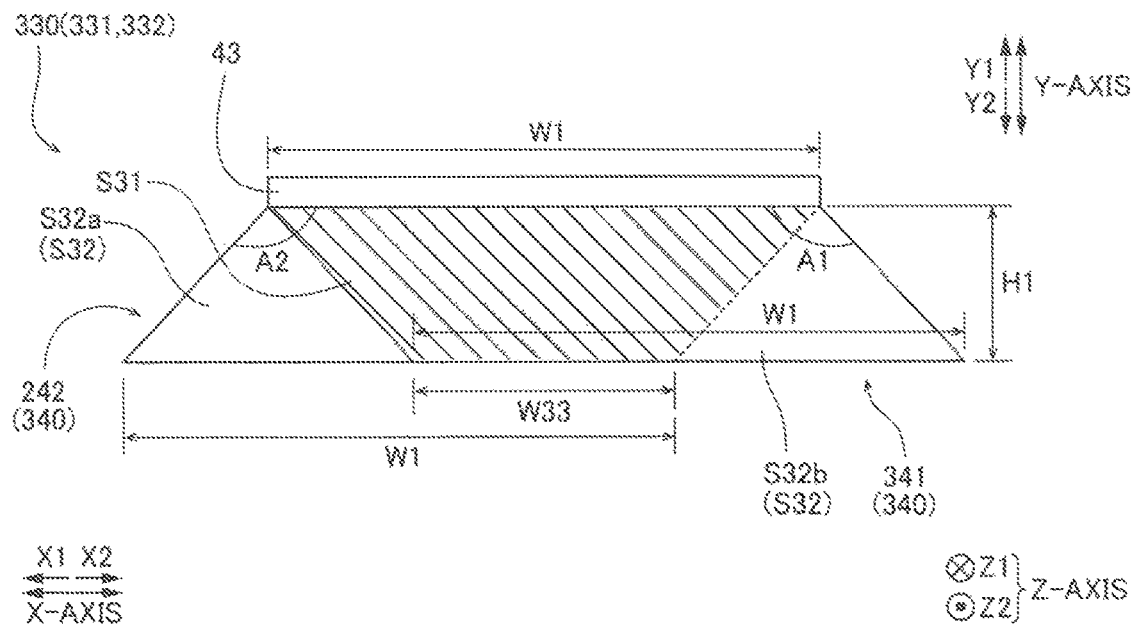
FIG. 11 is an enlarged plan view showing one of the coolers of the power converter according to the third modification of the first embodiment of the present invention.

As shown in FIG. 11, the fins 341 each include a base having a length W1 on the semiconductor device 21 side (Y1 side) in the Y-axis direction and a distal end having a length W1 on the side (Y2 side) opposite to the semiconductor device 21 side in the Y-axis direction, have a length (protrusion height) H1 in the Y-axis direction, and have a parallelogram shape as viewed in the Z-axis direction. That is, each of the fins 341 and the fins 242 has a polygonal shape different from a rectangular shape as viewed in the Z-axis direction. The bases of the fins 341 and the fins 242 on the semiconductor device 21 side are disposed at the same position as viewed in the Z-axis direction, and the fins 341 and the fins 242 are disposed such that an angle A1 defined by the base of each of the fins 341 on the semiconductor device 21 side and an end of each of the fins 341 on one side (X2 side) in the X-axis direction is equal to an angle A2 defined by the base of each of the fins 242 on the semiconductor device 21 side and an end of each of the fins 242 on the other side (X1 side) in the X-axis direction. That is, the fins 341 and the fins 242 are disposed symmetrically with respect to a centerline that passes through the center of the fins 341 or the fins 242 in the X-axis direction and extends in the Y-axis direction. In the power converter 320 according to the third modification of the first embodiment, the area of each of the fins 341 is substantially equal to the area of each of the fins 242 as viewed in the Z-axis direction.

The protrusion height H1 of each of the fins 341 in the Y-axis direction is substantially equal to the protrusion height H1 of each of the fins 242 in the Y-axis direction.

With the structure described above, in the power converter 320 according to the third modification of the first embodiment, an overlapping region S31 in which the fins 341 and the fins 242 face each other and non-overlapping regions S32 in which the fins 341 and the fins 242 do not face each other are located as viewed in the Z-axis direction. The overlapping region S31 is a hatched region in the drawings.

The overlapping region S31 includes a base having a length W1 on the semiconductor device 21 side (Y1 side) in the Y-axis direction and a distal end having a length W33 on the side (Y2 side) opposite to the semiconductor device 21 side in the Y-axis direction, and has a trapezoidal shape as viewed in the Z-axis direction. The length W1 of the base of the overlapping region S31 is equal to the length W1 of the base of each of the fins 341 and the fins 242 and is longer than the length W33 of the distal end of the overlapping region S31.

The non-overlapping regions S32 include a non-overlapping region S32a and a non-overlapping region S32b located on a first side (X1 side) and a second side (X2 side) of each of the fins 341 in the X-axis direction, respectively, so as to sandwich the overlapping region S31 therebetween in the X-axis direction.

Thus, in the non-overlapping region S32a and the non-overlapping region S32b, the fins 242 are adjacent to each other in the Z-axis direction, the fins 341 are adjacent to each other in the Z-axis direction, and a distance between the fins 340 is twice the predetermined fin pitch. Therefore, in the non-overlapping regions S32, the distance between the fins 340 is larger than in the overlapping region S31, and hence flow path resistance that occurs when traveling air passes between the fins 340 decreases.

In the power converter 320 according to the third modification of the first embodiment, the area of each of the fins 341 and the area of each of the fins 242 are substantially equal to each other, and hence the area of the non-overlapping region S32a in each of the fins 242 is substantially equal to the area of the non-overlapping region S32b in each of the fins 341.

The remaining structures of the third modification of the first embodiment are similar to those of the first embodiment and the second modification of the first embodiment.

In the power converter 320 according to the third modification of the first embodiment, as described above, the fins 341 and the fins 242 each have a parallelogram shape, and the angle A1 defined by the base of each of the fins 341 and the end (the end on the X2 side) of each of the fins 341 in a running direction (X-axis direction) is equal to the angle A2 defined by the base of each of the fins 242 and the end (the end on the X1 side) of each of the fins 242 in the running direction. Thus, the fins 340 each having a parallelogram shape are opposite to each other as viewed in an alignment direction (Z-axis direction), and hence as compared with the case where ones (fins 341) of the fins 341 and the fins 242 each have a rectangular shape and the others (fins 242) each have a parallelogram shape, the non-overlapping regions S32 can be more easily located so as to sandwich the overlapping region S31 therebetween. In addition, the fins 341 and the fins 242 have parallelogram shapes opposite to each other as viewed in the alignment direction such that the non-overlapping regions S32 located so as to sandwich the overlapping region S31 therebetween are symmetrical with respect to a centerline that extends in a direction perpendicular to the running direction, and hence as compared with the case where ones (fins 341) of the fins 341 and the fins 242 each have a rectangular shape and the others each have a parallelogram shape, it is possible to equally significantly reduce or prevent a decrease in the flow speed of the traveling air even when the running direction is reversed.

In the power converter 320 according to the third modification of the first embodiment, as described above, the protrusion height H1 of each of the fins 341 and the protrusion height H1 of each of the fins 242 are substantially equal to each other in a protruding direction (Y-axis direction) being perpendicular to the running direction (X-axis direction) and the alignment direction (Z-axis direction) and in which the plurality of fins 340 protrude. Thus, the length of the base of each of the fins 341 is equal to the length of the base of each of the fins 242 such that the area of each of the fins 341 and the area of each of the fins 242 can be substantially equal to each other in the alignment direction (Z-axis direction), and hence the heat radiation amount from the fins 341 and the heat radiation amount from the fins 242 can be substantially equal to each other. As a result, the surface temperature of the semiconductor device 21 on the side on which the fins 341 and the fins 242 are placed can be easily equalized, and variations in thermal resistance in the semiconductor device 21 can be significantly reduced or prevented.

The remaining effects of the third modification of the first embodiment are similar to those of the first embodiment and the second modification of the first embodiment.

Second Embodiment

A second embodiment is now described with reference to FIGS. 12 and 13. According to the second embodiment, coolers 430 having the same structure as the coolers 30 according to the first embodiment and that protrude downwardly of a semiconductor device 21 are provided. In the figures, the same structures as those of the first embodiment are denoted by the same reference numerals.

Figure 12:
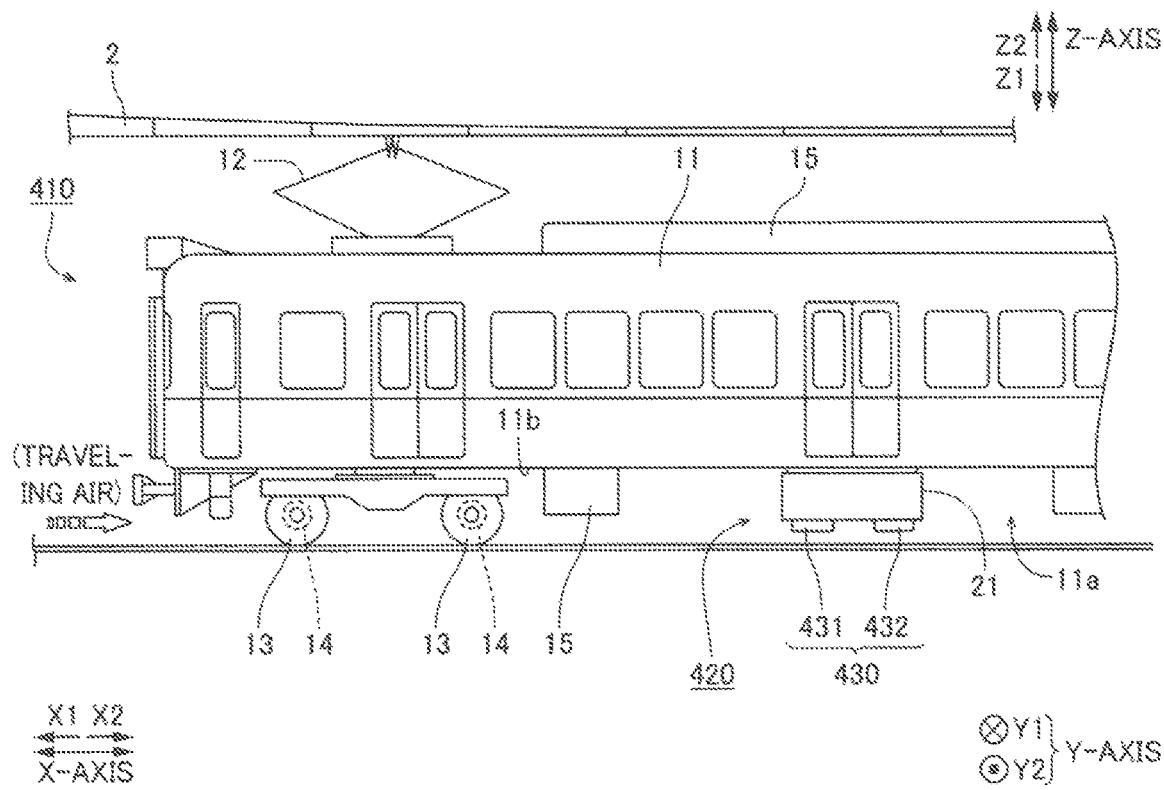
FIG. 12 is a side elevational view showing a railroad vehicle according to a second embodiment of the present invention.
Figure 13:
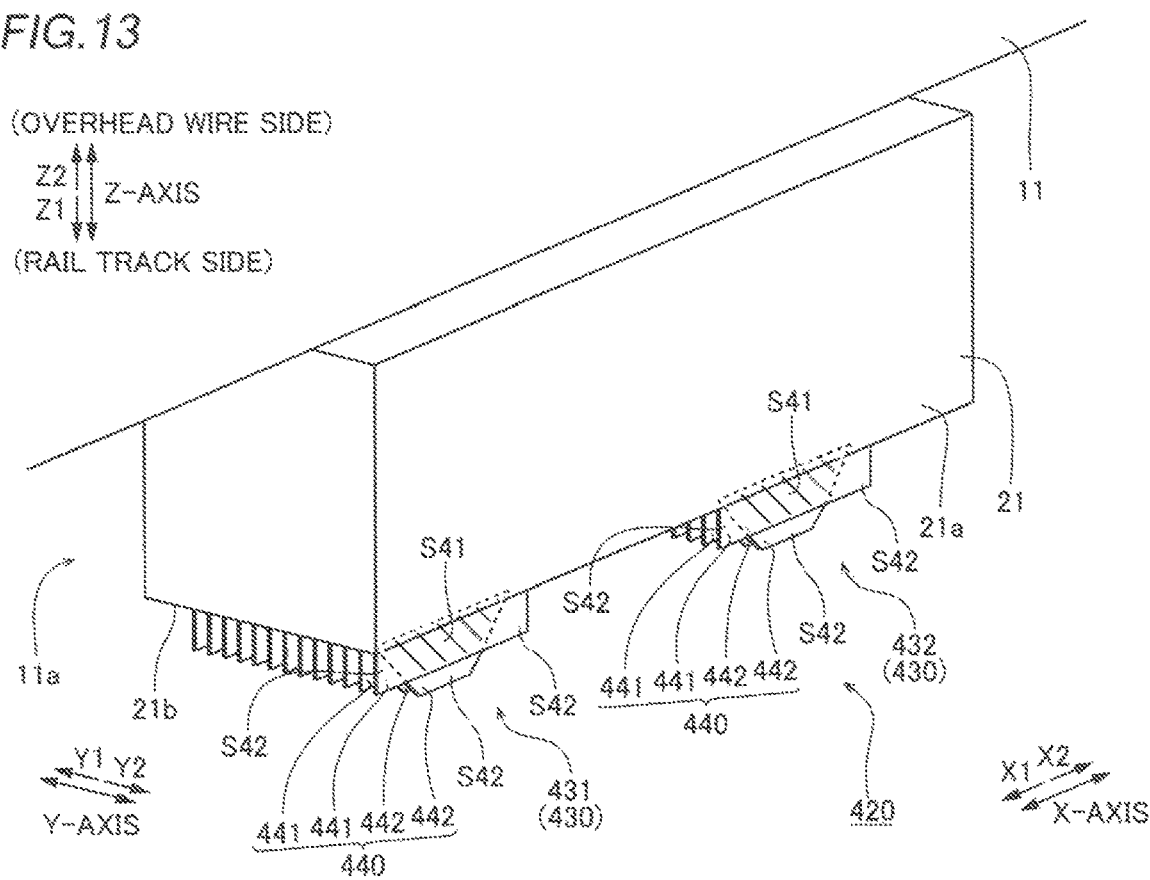
FIG. 13 is a perspective view showing coolers of a power converter according to the second embodiment of the present invention.

As shown in FIGS. 12 and 13, a power converter 420 for a railroad vehicle 410 according to the second embodiment of the present invention includes the semiconductor device 21 and a plurality of coolers 430. As shown in FIG. 12, in the power converter 420, the plurality of coolers 430 are disposed downwardly (in a direction Z1) of the semiconductor device 21. The plurality of coolers 430 include a cooler 431 on an X1 side and a cooler 432 on an X2 side, which are disposed at a predetermined interval in an X-axis direction. The power converter 420 is an example of a "power converter for a railroad vehicle" in the claims. The cooler 431 and the cooler 432 are examples of a "first cooler" and a "second cooler" in the claims, respectively.

Each of the cooler 431 and the cooler 432 includes a plurality of fins 440 that protrude downwardly (in the direction Z1) from the lower surface 21b of the semiconductor device 21 on a Z1 side and extend in a thin plate shape along the X-axis direction. As shown in FIG. 13, the plurality of fins 440 have outer shapes different from each other as viewed in a Y-axis direction, and include a plurality of fins 441 and a plurality of fins 442 that protrude in a Z-axis direction. The fins 441 and the fins 442 are adjacent to each other so as to be alternately aligned in the Y-axis direction with a predetermined fin pitch. That is, the plurality of fins 441 and the plurality of fins 442 are disposed adjacent to each other in the Y-axis direction.

With the structure described above, in the power converter 420 according to the second embodiment, an overlapping region S41 in which the fins 441 and the fins 442 face each other and non-overlapping regions S42 in which the fins 441 and the fins 442 do not face each other are located as viewed in the Y-axis direction, similarly to the power converter 20 according to the first embodiment. Thus, in the non-overlapping regions S42 located on a first side (X1 side) and a second side (X2 side) of each of the fins 441 in the X-axis direction, the fins 441 are adjacent to each other in the Y-axis direction, and a distance between the fins 440 is twice the predetermined fin pitch. Therefore, in the non-overlapping regions S42 located on the X1 side and the X2 side of each of the fins 441, the distance between the fins 440 is larger than in the overlapping region S41, and hence flow path resistance that occurs when traveling air passes between the fins 440 decreases.

The structure of the power converter 420 according to the second embodiment is obtained by replacing the coolers 30 provided laterally of the semiconductor device 21 in the power converter 20 according to the first embodiment by the coolers 430 provided downwardly of the semiconductor device 21. Therefore, the remaining structures of the power converter 420 according to the second embodiment are the same as those of the power converter 20 according to the first embodiment except that the Y-axis direction (protrusion direction) and the Z-axis direction (alignment direction) of the power converter 20 according to the first embodiment are referred to as the Z-axis direction and the Y-axis direction, respectively.

(Effects of Second Embodiment)

As described above, the power converter 420 according to the second embodiment includes the fins 441 and the fins 442 having outer shapes different from each other as viewed in an alignment direction (Y-axis direction), and on both ends (ends on the X1 side and the X2 side) of the fins 441 and the fins 442 in the running direction (X-axis direction), the non-overlapping regions S42 in which the fins 441 and the fins 442 do not face each other in the alignment direction are located so as to sandwich the overlapping region S41, in which the fins 441 and the fins 442 face each other in the alignment direction, therebetween. Thus, similarly to the power converter 20 according to the first embodiment, the flow path resistance of the traveling air between the fins 440 can be decreased. As a result, the cooling performance of the coolers 430 can be improved by reducing a decrease in the flow speed of the traveling air by a decrease in the flow path resistance of the traveling air between the fins 440.

In the power converter 420 according to the second embodiment, as described above, the coolers 430 are placed in an underfloor space of the railroad vehicle 410, and the plurality of fins 440 provided in the coolers 430 protrude downwardly (in the direction Z1) of the railroad vehicle 410. Thus, when a space for placing the coolers 430 is sufficient under the semiconductor device 21, the coolers 430, the cooling performance of which can be improved by significantly reducing or preventing a decrease in the flow speed of the traveling air, can be easily placed.

The remaining effects of the second embodiment are similar to those of the first embodiment.

Third Embodiment

A third embodiment is now described with reference to FIGS. 14 and 15. According to the third embodiment, coolers 530 having both the same structure as the coolers 30 according to the first embodiment and the same structure as the coolers 430 according to the second embodiment are provided. In the figures, the same structures as those of the first embodiment and the second embodiment are denoted by the same reference numerals.

Figure 14:
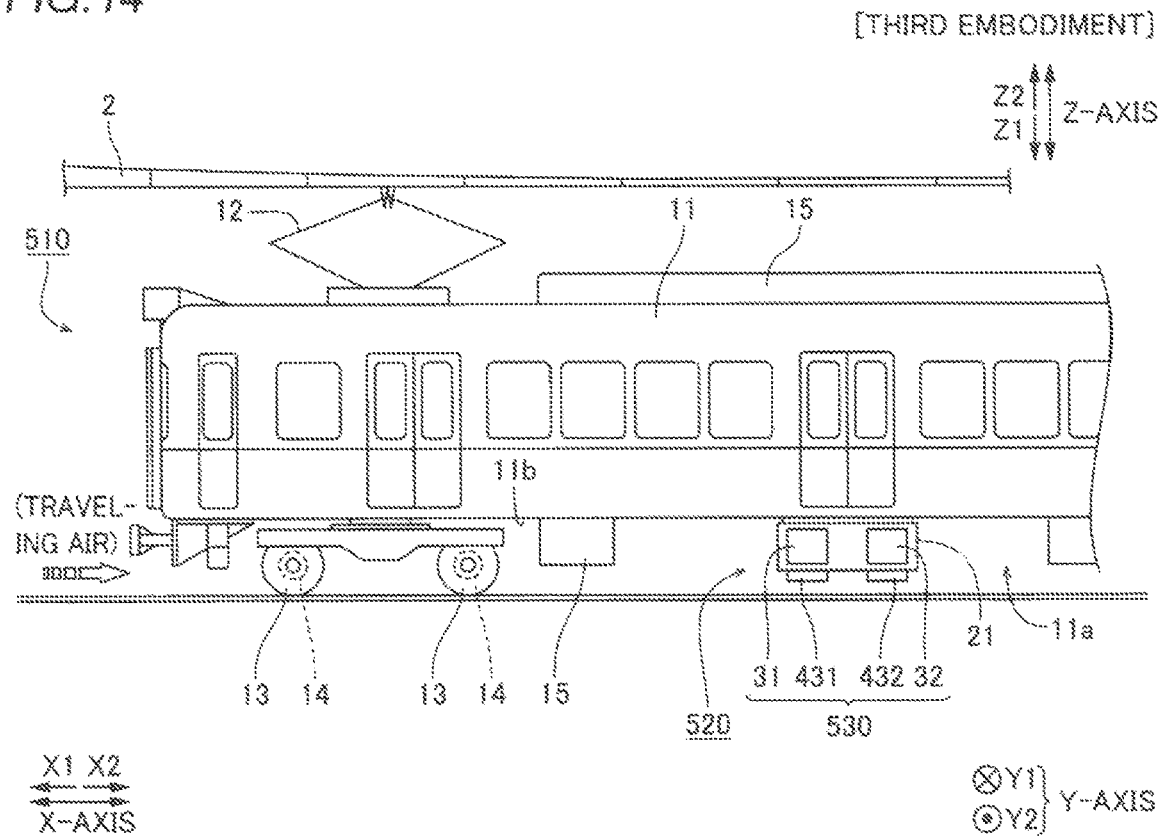
FIG. 14 is a side elevational view showing a railroad vehicle according to a third embodiment of the present invention.

As shown in FIGS. 14 and 15, a power converter 520 for a railroad vehicle 510 according to a third embodiment of the present invention includes a semiconductor device 21 and a plurality of coolers 530. As shown in FIG. 14, in the power converter 520, the plurality of coolers 530 are disposed laterally (in a direction Y2) and downwardly (in a direction Z1) of the semiconductor device 21. The plurality of coolers 530 include a cooler 31 on an X1 side and a cooler 32 on an X2 side which are disposed at a predetermined interval in an X-axis direction laterally of the semiconductor device 21, and a cooler 431 on the X1 side and a cooler 432 on the X2 side which are disposed at a predetermined interval in the X-axis direction downwardly of the semiconductor device 21. The power converter 520 is an example of a "power converter for a railroad vehicle" in the claims.

The structure of the power converter 520 according to the third embodiment is obtained by providing the coolers 30 provided laterally of the semiconductor device 21 in the power converter 20 according to the first embodiment and the coolers 430 provided downwardly of the semiconductor device 21 in the power converter 420 according to the second embodiment as the coolers 530 laterally and downwardly of the semiconductor device 21, respectively. Therefore, the structure of the power converter 520 according to the third embodiment combines the structure of the power converter 20 according to the first embodiment and the structure of the power converter 420 according to the second embodiment.

Therefore, the effects of the power converter 520 according to the third embodiment combine the effects of the power converter 20 according to the first embodiment and the effects of the power converter 420 according to the second embodiment. In other words, the cooling performance of the coolers 530 can be improved by reducing a decrease in the flow speed of traveling air by decreases in the flow path resistance of the traveling air between the fins 40 and between the fins 440. As a result, as compared with the structure of the power converter 20 according to the first embodiment in which the coolers are provided only laterally of the semiconductor device 21 and the power converter 420 according to the second embodiment in which the coolers are provided only downwardly of the semiconductor device 21, the cooling performance of the coolers 530 can be further improved.

Other Modifications

The embodiments and modifications disclosed this time must be considered as illustrative in all points and not restrictive. The range of the present invention is shown not by the above description of the embodiments and modifications but by the scope of claims for patent, and all modifications within the meaning and range equivalent to the scope of claims for patent are further included.

For example, while the present invention is applied to the power converter 20, 120, 220, 320, 420, or 520 placed in the underfloor space 11a of the vehicle body 11, and the plurality of fins 40 in each of the aforementioned first to third embodiments, the present invention is not restricted to this. For example, the present invention may alternatively be applied to the power converter placed on the roof of the vehicle body 11.

While the fins having outer shapes different from each other as viewed in the alignment direction have substantially the same area in each of the aforementioned first to third embodiments, the present invention is not restricted to this. According to the present invention, the fins having outer shapes different from each other as viewed in the alignment direction may alternatively have areas different from each other.

While the two coolers are aligned at the predetermined interval in the running direction in each of the aforementioned first to third embodiments, the present invention is not restricted to this. According to the present invention, only one cooler may alternatively be provided along the running direction, or three or more coolers may alternatively be provided at predetermined intervals.

While the two coolers include the same combination of the two types of fins having outer shapes different from each other as viewed in the alignment direction in each of the aforementioned first to third embodiments, the present invention is not restricted to this. According to the present invention, the two coolers may alternatively include different combinations of the two types of fins having outer shapes different from each other as viewed in the alignment direction. For example, one of the coolers may alternatively be the cooler 30 according to the first embodiment, and the other of the coolers may alternatively be the cooler 230 according to the second modification of the first embodiment.

While the two types of fins having outer shapes different from each other as viewed in the alignment direction are alternately aligned as viewed in the alignment direction in each of the aforementioned first to third embodiments, the present invention is not restricted to this. According to the present invention, fins having the same outer shape may alternatively be adjacent to each other as viewed in the alignment direction. That is, the fins having the same outer shape may be adjacent to each other at least partially in the alignment direction, and the two types of fins having outer shapes different from each other may not be adjacent to each other over the alignment direction.

While the two types of fins having outer shapes different from each other as viewed in the alignment direction are provided in each of the aforementioned first to third embodiments, the present invention is not restricted to this. According to the present invention, three or more types of fins having outer shapes different from each other as viewed in the alignment direction may alternatively be provided.

While the lengths W1 of the bases on the semiconductor device 21 side of the two types of fins having outer shapes different from each other as viewed in the alignment direction are equal to each other and the two types of fins are not shifted with respect to each other in the running direction (are located at the same position in the running direction) in each of the aforementioned first to third embodiments, the present invention is not restricted to this. According to the present invention, the lengths of the bases of the two types of fins may alternatively be different from each other, or the two types of fins may alternatively be shifted with respect to each other in the running direction.

While the cooler 31 (131, 231, or 331) and the cooler 32 (132, 232, or 332) are provided on the side surface of the semiconductor device 21 on one side (Y2 side) in each of the aforementioned first and third embodiments, the present invention is not restricted to this. According to the present invention, the cooler 31 (131, 231, or 331) and the cooler 32 (132, 232, or 332) may alternatively be provided on the side surface of the semiconductor device 21 on the other side (Y1 side). Furthermore, the cooler 31 (131, 231, or 331) and the cooler 32 (132, 232, or 332) may alternatively be provided on the side surfaces of the semiconductor device 21 on both sides.

While the present invention is applied to the power converter 20, 120, 220, 320, 420, or 520 of the catenary railroad vehicle 10, 410, or 510 that runs using electric power from the overhead wire 2 in each of the aforementioned first to third embodiments, the present invention is not restricted to this. The present invention may alternatively be applied to a power converter of a third rail type railroad vehicle 10, 410, or 510 that collects electric power by scraping a collector shoe provided on a vehicle body 11 against a third rail for power feeding (third rail) separately laid along a rail for running.

While the present invention is applied to the power converter 20, 120, 220, 320, 420, or 520 of the catenary railroad vehicle 10, 410, or 510 that runs using electric power from the overhead wire 2 in each of the aforementioned first to third embodiments, the present invention is not restricted to this. More specifically, the present invention may alternatively be applied to cool a device mounted on a diesel railcar that uses a diesel engine as a direct drive source or cool a power converter of a railroad vehicle 10, 410, or 510 such as an electric diesel railcar that rotates induction motors 14 by power generation of a diesel engine.

What is claimed is:

1. A power converter for a railroad vehicle, comprising:
a power converter body mounted on the railroad vehicle; and
a cooler that radiates heat of the power converter body, wherein the cooler includes a plurality of fins that extends in a running direction of the railroad vehicle,
the plurality of fins includes a first fin and a second fin aligned in an alignment direction so as to be adjacent to each other and having outer shapes different from each other as viewed in the alignment direction, the first fin has a first region that does not face the second fin adjacent to the first fin as viewed in the alignment direction, and the second fin has a second region that does not face the first fin adjacent to the second fin as viewed in the alignment direction, the first region and the second region being formed as non-overlapping regions of the first fin and the second fin, an overlapping region, in which the first fin and the second fin face each other in the alignment direction, is located between the non-overlapping region of the first fin and another non-overlapping region of the first fin, or between the non-overlapping region of the first fin and the non-overlapping region of the second fin, and in the running direction, a length of a base of the overlapping region on a power converter body side is longer than a length of a distal end of the overlapping region on a side opposite to the power converter body side;

wherein the non-overlapping region of the second fin is located outside the overlapping region at the side opposite to the power converter body side, and the non-overlapping region of the first fin and the another non-overlapping region of the first fin are located at end portions of the first fin in the running direction to surround the overlapping region with the non-overlapping region of the second fin as viewed in the alignment direction, and the non-overlapping region of the first fin and the non-overlapping region of the second fin have areas substantially equal to each other such that a heat radiation amount from the first fin and a heat radiation amount from the second fin are substantially equal to each other.

2. The power converter for a railroad vehicle according to claim 1, wherein the first fin and the second fin are alternately disposed.

3. The power converter for a railroad vehicle according to claim 1, wherein at least one of the first fin and the second fin has a polygonal shape different from a rectangular shape as viewed in the alignment direction.

4. The power converter for a railroad vehicle according to claim 3, wherein one of the first fin and the second fin has a rectangular shape as viewed in the alignment direction, and the other of the first fin and the second fin has a trapezoidal shape or a triangular shape as viewed in the alignment direction.

5. The power converter for a railroad vehicle according to claim 4, wherein a protrusion height of the first fin and a protrusion height of the second fin are different from each other in a protruding direction being perpendicular to the running direction and the alignment direction and in which the plurality of fins protrudes.

6. The power converter for a railroad vehicle according to claim 1, wherein the cooler is placed in an underfloor space of the railroad vehicle, and the plurality of fins provided in the cooler protrudes laterally of the railroad vehicle.

7. The power converter for a railroad vehicle according to claim 1, wherein the cooler is placed in an underfloor space of the railroad vehicle, and the plurality of fins provided in the cooler protrudes downwardly of the railroad vehicle.

8. The power converter for a railroad vehicle according to claim 1, wherein the cooler includes a first cooler and a second cooler disposed at a predetermined interval in the running direction, and each of the first cooler and the second cooler includes the first fin and the second fin.

9. A power converter for a railroad vehicle, comprising:
a power converter body mounted on the railroad vehicle; and
a cooler that radiates heat of the power converter body,
wherein the cooler includes a plurality of fins that extends in a running direction of the railroad vehicle,
the plurality of fins includes a first fin and a second fin aligned in an alignment direction so as to be adjacent to each other and having outer shapes different from each other as viewed in the alignment direction,
the first fin has a first region that does not face the second fin adjacent to the first fin as viewed in the alignment direction, and the second fin has a second region that does not face the first fin adjacent to the second fin as viewed in the alignment direction, the first region and the second region being formed as non-overlapping regions of the first fin and the second fin,
an overlapping region, in which the first fin and the second fin face each other in the alignment direction, is located between the non-overlapping region of the first fin and another non-overlapping region of the first fin, or between the non-overlapping region of the first fin and the non-overlapping region of the second fin, and
in the running direction, a length of a base of the overlapping region on a power converter body side is longer than a length of a distal end of the overlapping region on a side opposite to the power converter body side;
wherein at least one of the first fin and the second fin has a polygonal shape different from a rectangular shape as viewed in the alignment direction;
wherein the first fin and the second fin each have a parallelogram shape, and
an angle defined by the base and an end of the first fin on one side in the running direction is equal to an angle defined by the base and an end of the second fin on the other side in the running direction;
wherein the non-overlapping region of the first fin is located on one end portion of the first fin in the running direction, and the non-overlapping region of the second fin is located on one end portion of the second fin opposite to the one end portion of the first fin in the running direction, and
the parallelogram shape has an acute angle and an obtuse angle, and the overlapping region has the trapezoidal shape between the non-overlapping region of the first fin and the non-overlapping region of the second fin as viewed in the alignment direction.

* * * * *